United States Patent [19]

Miyasaka

[11] 4,354,256.

[45] Oct. 12, 1982

[54] SEMICONDUCTOR MEMORY DEVICE

[75] Inventor: Kiyoshi Miyasaka, Yokohama, Japan

[73] Assignee: Fujitsu Limited, Kawasaki, Japan

[21] Appl. No.: 145,346

[22] Filed: Apr. 30, 1980

[30] Foreign Application Priority Data

May 4, 1979 [JP] Japan ............................. 54/54915

[51] Int. Cl.$^3$ ............................................. G11C 11/40
[52] U.S. Cl. ................................. 365/189; 365/230; 365/238
[58] Field of Search ........................ 365/189, 230, 238

[56] References Cited

U.S. PATENT DOCUMENTS 3,763,480 10/1973 Weimer ............................. 365/238
3,857,046 12/1974 Varadibrairwood et al. ...... 365/174
3,930,239 12/1975 Salters et al. ..................... 307/238

OTHER PUBLICATIONS

IEEE Journal of Solid–State Circuits vol. SC11, No. 5, Oct. 1976, "Two 4K Static 5-V Rams" pp. 602–609.

Primary Examiner—Terrell W. Fears
Attorney, Agent, or Firm—Staas & Halsey

[57] ABSTRACT

A semiconductor memory device, comprising N memory cell arrays each of which includes a plurality of memory cells, is arranged to enable the use of said semiconductor memory device in the form of both one-bit-per-word N-bits-per-word. Two separate sets of output gates are provided, together with an additional input line for selecting between the two sets of gates. One set of gates is connected to provide one-bit output, and the other set of gates is connected to provide N-bit output.

10 Claims, 4 Drawing Figures (1K WORDS × 4 BITS)

(4K WORDS × 1 BIT)

SEMICONDUCTOR MEMORY DEVICE

BACKGROUND OF THE INVENTION

The present invention relates to a semiconductor memory device which can be used in the different forms of the bit structure of a word.

DESCRIPTION OF THE PRIOR ART

A prior art manner of use of integrated circuit type semiconductor memory devices is illustrated in FIGS. 1A and 1B. FIG. 1A illustrates a memory system using four 1K (1024 bits) memory units 11', 12', 13', and 14'. The four memory units 11', 12', 13', and 14' are controlled by decoders 4X and 4Y. Output gates 31', 32', 33', and 34' are connected to the memory units 11', 12', 13', and 14'. Thus, four bits of data are obtained at the output terminals 71', 72', 73', and 74' of the output gates 31', 32', 33', and 34'. Accordingly, data in the form of "1K words×4 bits" is obtained in the memory system of FIG. 1A.

FIG. 1B illustrates a memory system using a 4K (4096 bits) memory unit 10' which is controlled by decoders 8X and 8Y. An output gate 30' is connected to the memory unit 10'. Thus, one bit of data is obtained at the output terminal 70' of the output buffer 30'. Accordingly, data in the form of "4K words×1 bit" is obtained in the memory system of FIG. 1B.

The structure of each of the memory cell arrays used in the device of FIG. 1B is the same as that of FIG. 1A. However, the structure of the associated circuitry (including information writing-in and information reading-out circuitry, decoders and output gates) for the memory cells arrays of the device of FIG. 1B, is different from that of FIG. 1A.

Accordingly, although the memory cell arrays are manufactured in the same process for both the devices of FIGS. 1A and 1B, two alternative versions of the final step of the processes for manufacturing the devices of FIGS. 1A and 1B are necessary in which the aforementioned different associated circuitries are incorporated with the memory cell arrays using different masks for forming the different associated circuitries.

Thus, it is inconvenient that the device of FIG. 1A of the "1K words×4 bits" type and the device of FIG. 1B of the "4K words×1 bit" type cannot be manufactured in the same process, i.e., the manufacture of the devices of FIGS. 1A and 1B necessitates two kinds of processes. The present invention has been proposed in order to eliminate the above described inconvenience in the manufacture of semiconductor memory devices.

SUMMARY OF THE INVENTION

It is the principal object of the present invention to provide a semiconductor memory device which can be used both as the device of the "1 bit per word" type and the "N bits per word" type without needing two kinds of processes of manufacture.

In accordance with the present invention, a semiconductor memory device is provided which comprises N memory cell arrays, each of the arrays including a plurality of memory cells, a group of output gates of a first kind which produce in parallel a plurality of 1-bit output signals of the N memory cell arrays, and a gate of a second kind which produces a sequence of 1-bit output signals selected from the N memory cell arrays, whereby either the group of output gates of the first kind or the gate of the second kind is caused to operate, so that either the plurality of 1-bit output signals produced in parallel or the sequence of 1-bit output signals is available.

DESCRIPTION OF THE PREFERRED EMBODIMENTS

Figure 1A:
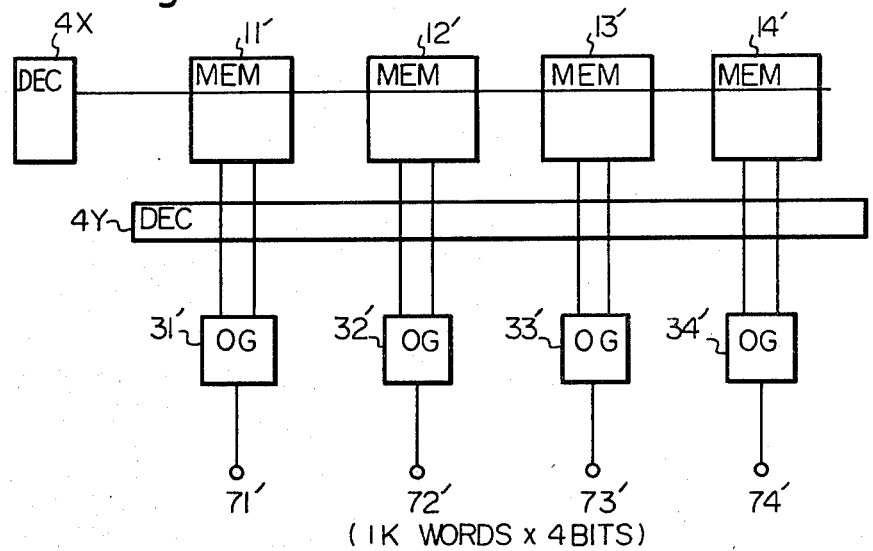
FIGS. 1A and 1B illustrate prior art semiconductor memory devices using two kinds of integrated circuits of memory devices.
Figure 1B:
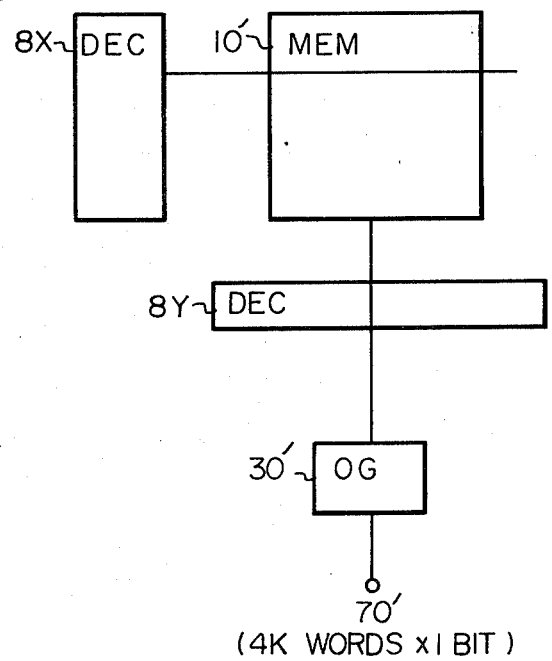
Figure 2:
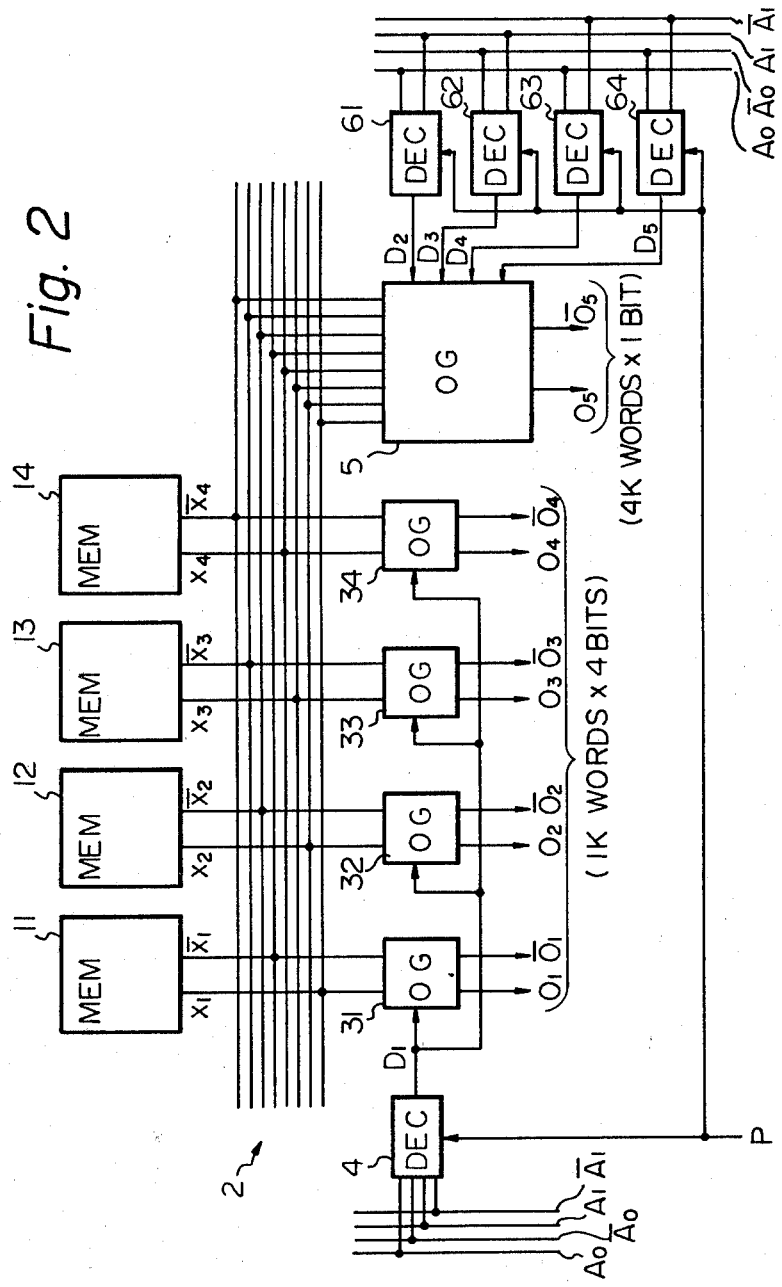
FIG. 2 illustrates a semiconductor memory device in accordance with an embodiment of the present invention, and, FIG. 3 illustrates in detail the circuit of the semiconductor memory device of FIG. 2.

In the device illustrated in FIG. 2 as an embodiment of the present invention, memory units 11, 12, 13, and 14, each of which is of the 1K (1024 bits) type, are provided. The outputs of the memory units 11, 12, 13, and 14 are connected to the output gates 31, 32, 33, and 34 of a first kind, respectively, and to the output gate 5 of a second kind, via the bus lines 2. The output gates 31, 32, 33, and 34 of the first kind can be controlled in parallel by a decoder circuit 4, and the output gate 5 of the second kind can be controlled sequentially by decoder circuits 61, 62, 63, and 64. The decoder circuit 4 is controlled by address inputs (address input signals) $A_0$, $\overline{A}_0$, $A_1$, and $\overline{A}_1$. The decoder circuits 61, 62, 63 and 64 are controlled by address inputs $A_0$, $\overline{A}_0$, $A_1$, and $\overline{A}_1$, in such a manner that a "HIGH" signal is produced in sequence in the output lines $D_2$, $D_3$, $D_4$, and $D_5$ of the decoder circuits 61, 62, 63, and 64 corresponding to selections "$A_0 A_1$", "$\overline{A}_0 A_1$", "$A_0 \overline{A}_1$" and "$\overline{A}_0 \overline{A}_1$" of the address inputs. Thus, the output gates 31, 32, 33, and 34 of the first kind can read out four bits of information from the memory units 11, 12, 13, and 14 as a "1K words×4 bits" reading-out, while the output gate 5 of the second kind can read out one bit of information from the memory units 11, 12, 13, and 14 as the "4K words×1 bit" reading-out.

Figure 3:
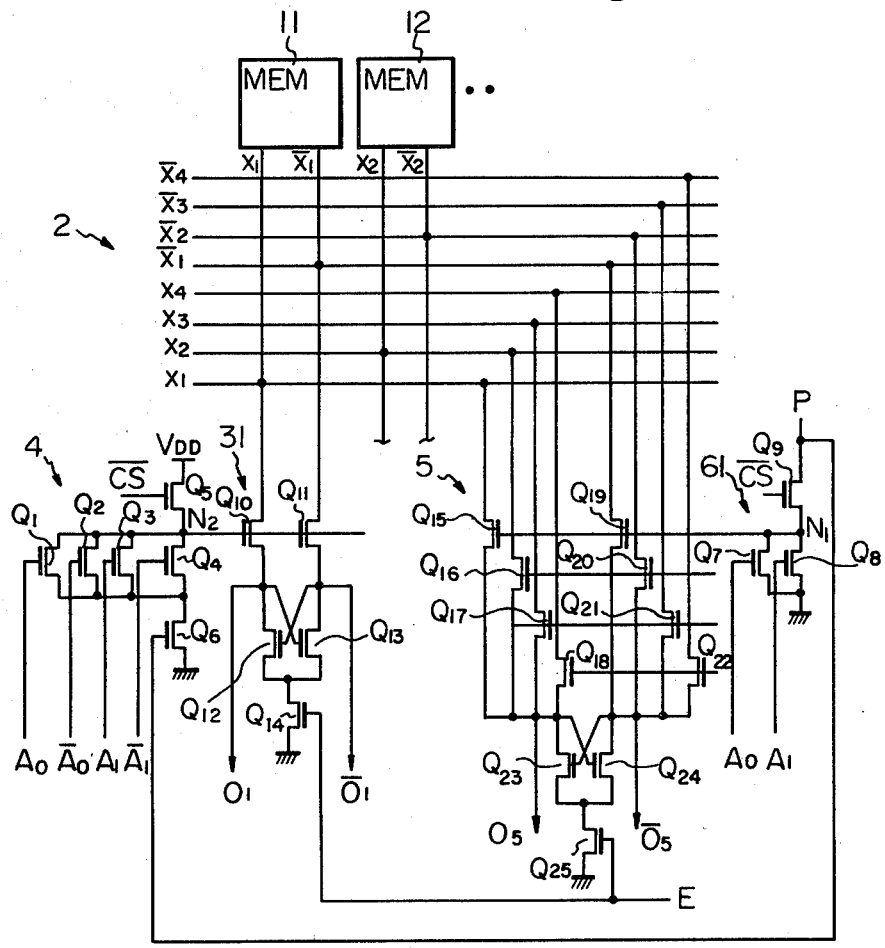

The output gate 31, the decoder circuit 4, the output gate 5 and the decoder circuit 61 of FIG. 2 are illustrated in detail in FIG. 3. The decoder circuit 4 comprises parallel connected transistors $Q_1$, $Q_2$, $Q_3$, and $Q_4$ controlled by address inputs $A_0$, $\overline{A}_0$, $A_1$, and $\overline{A}_1$, a transistor $Q_5$ controlled by an inverted chip select signal $\overline{CS}$ and connected between $V_{DD}$ and the parallel connected transistors, and a transistor $Q_6$ controlled by the potential of a point P and connected between the parallel connected transistors and the ground. The output signal of the decoder circuit 4 is produced at the node $N_2$ of the transistor $Q_5$ and the parallel connected transistor $Q_1$ through $Q_4$.

The decoder circuit 61 comprises parallel connected transistors $Q_7$ and $Q_8$ controlled by address inputs $A_0$ and $A_1$, and a transistor $Q_9$ controlled by the inverted chip select signal $\overline{CS}$ and connected between the point P and the parallel connected transistors $Q_7$, $Q_8$. The output signal of the decoder circuit 61 is produced at the node $N_1$ of the transistor $Q_7$ and the parallel connected transistors $Q_7$ and $Q_8$.

The output gate 31 comprises a pair of transistors $Q_{10}$ and $Q_{11}$ for switching on and off the path from the memory unit 11 to the output lines $O_1$, $\overline{O}_1$ in accordance with the output signal of the decoder circuit 4, and a reading-out buffer circuit consisting of transistor $Q_{12}$, $Q_{13}$, and $Q_{14}$. The output gate 5 comprises transistors $Q_{15}$, $Q_{16}$, $Q_{17}$, and $Q_{18}$ controlled by the output signals of the decoder circuits 61, 62, 63, and 64 and connected between the output lines $\overline{X}_1$, $\overline{X}_2$, $\overline{X}_3$ and $X_4$ of the memory units 11, 12, 13, and 14 and an output line $O_5$, transistors $Q_{19}$, $Q_{20}$, $Q_{21}$, and $Q_{22}$ controlled by the output signals of the decoder circuits 61, 62, 63, and 64 and connected between the output lines $X_1$, $X_2$, $X_3$ and $X_4$ of the memory units 11, 12, 13 and 14 and another output line $O_5$, and a reading-out buffer circuit consisting of transistors $Q_{23}$, $Q_{24}$, and $Q_{25}$. The transistor $Q_{14}$ of the reading-out buffer circuit of the output gate 31 and the transistor $Q_{25}$ of the reading-out buffer circuit of the output gate 5 are controlled by a read-out signal E. For example, MIS FETs are used as the transistors $Q_1$ through $Q_{25}$.

In the device of FIG. 2, the potential of the point P can be selected as either being positive or being negative corresponding to the selection of the connection of the point P to either a positive power line (pad) or a negative power line (pad) of the package of the integrated circuit of the semiconductor memory device. Such a selective connection is formed by means of a wire-bonding process in the manufacture of the integrated circuit of the semiconductor memory device.

The operation of the device of FIG. 2 will be described hereinafter under the condition that the potential of the point P is positive and the transistors $Q_1$ through $Q_{25}$ illustrated in FIG. 3 are N channel type MIS FETs.

Under this condition, the output gates 31, 32, 33 and 34 are turned off because of the "LOW" level signal at the output terminal (node) $N_2$ of the decoder circuit 4, but the output gate 5 is in an operative state because of the operative state of the decoder circuits 61, 62, 63 and 64.

This is because the potential of the node $N_2$ is caused to be "LOW" due to the conduction of the transistor $Q_6$, one of the transistors $Q_1$ through $Q_4$ and the transistor $Q_5$, even when the node $N_2$ is supplied with a precharging voltage upon application of the inverted chip select signal $\overline{CS}$ to the gate of the transistor $Q_5$.

The output signals of the decoder circuits 61, 62, 63, and 64 are turned "HIGH" in sequence in accordance with the changes of the levels of the address inputs $A_0$, $\overline{A}_0$, $A_1$, and $\overline{A}_1$. When the output signal of the decoder circuit 61 is turned "HIGH", only the transistors $Q_{15}$ and $Q_{19}$ are turned on, so that only the output of the memory unit 11 is transmitted to the one bit output terminals $O_5$, $\overline{O}_5$ of the output gate 5. Then, when the output signal of the decoder circuit 62 is turned "HIGH", only the transistors $Q_{16}$ and $Q_{20}$ are turned on, so that only the output of the memory unit 12 is transmitted to the one bit output terminals $O_5$, $\overline{O}_5$ of the output gate 5. And then, similar operations are carried out in sequence in accordance with the turning-high of the decoder circuits 63 and 64, so that the outputs of the memory units 13 and 14 are transmitted in sequence to the one bit output terminals $O_5$, $\overline{O}_5$. As described above, such a connection of the point P to the positive potential enables the use of the semiconductor memory device of FIG. 2 as an integrated circuit type memory device of "4K words×1 bit".

Contrary to this, the operation of the device of FIG. 2 will be described hereinafter under the condition the potential of the point P is zero or negative and the transistor $Q_1$ through $Q_{25}$ illustrated in FIG. 3 are N channel type MIS FETs.

Under this condition, the output gate 5 is turned off because of the "LOW" level signals at the output terminals of the decoder circuits 61, 62, 63, and 64, but the output gates 31, 32, 33, and 34 are turned on because of the operative state of the decoder circuit 4.

This is because the potential of the node $N_1$ cannot be "HIGH" because of zero or negative potential of the point P, but the potential of the node $N_2$ is "HIGH", because the transistor $Q_6$ is "OFF" regardless of the states of the transistors $Q_1$ through $Q_4$, upon application of an inverted chip select signal $\overline{CS}$ to the gate of the transistor $Q_5$.

Thus, the output signal of the decoder circuit 4 is "HIGH", and accordingly the output gates 31, 32, 33, and 34 are turned on, so that the outputs of the memory units 11, 12, 13, and 14 are transmitted in parallel to the output terminals $O_1$ and $\overline{O}_1$, $O_2$ and $\overline{O}_2$, $O_3$ and $\overline{O}_3$ and $O_4$ and $\overline{O}_4$. As described above, such a connection of the point P to the zero or negative potential enables the use of the semiconductor memory device of FIG. 2 as an integrated circuit type memory device of "1K words×4 bits".

Although the above description is related to a preferred embodiment, various modifications of such a embodiment are possible. The output gates 31, 32, 33, and 34 can be controlled by a decoder circuit which consists of general control circuits which are controlled by the potential of the point P, instead of the decoder circuit 4 illustrated in FIG. 3. The number of bits corresponding to a word can be selected by varying the number of the output gates of the first kind. The number of cells in a memory unit of FIG. 2 can be selected other than 1K bits (1024 bits). Bipolar transistors can be used for the transistors $Q_1$ through $Q_{25}$, though field effect type transistors are used in the circuit of FIG. 3.

Also, according to an embodiment of the present invention, it is possible to prepare a device in which a memory cell array of 4 K words×4 bits is formed in a semiconductor chip by means of the master slice technique, and provide either a 16K memory device having the structure of 4K words×4 bits or a 16K memory device having the structure of 16K words×1 bit by switching the connection of the above mentioned point P to the different potentials, in accordance with requirements of users.

I claim:

1. A semiconductor memory device comprising:
N memory cell arrays, each of said arrays including a plurality of memory cells,
a plurality of address lines for selectively addressing individual memory cells of said arrays,
a group of output gates of a first kind respectively corresponding to said memory cell arrays and operable when selectively enabled for simultaneously producing in parallel a corresponding plurality of 1-bit output signals selected from said respective N memory cell arrays by said address lines,
a gate of a second kind common to all of said memory cell arrays and operable when selectively enabled for producing a particular 1-bit output signal selected from said N memory cell arrays by said address lines,
a first decoder circuit for simultaneously enabling said output gates of said first kind,
N other decoder circuits for enabling said gate of said second kind,
a power supply terminal and a ground terminal, means for selectively applying relatively higher and lower potentials to said power supply terminal, said first decoder circuit and said N other decoder circuits respectively including means connected to said power supply terminal and responsive to said relatively higher and lower potentials thereof, selectively, for enabling said group of output gates of said first kind and disabling said gate of said second kind, and for disabling said output gates of said first kind and enabling said output gate of said second kind, said N memory cell arrays, said output gates of said first and said second kinds, said first decoder circuit, said N other decoder circuits, and said selective potential applying means being formed on a common semiconductor substrate.

2. A semiconductor memory device as defined in claim 1, mounted in a package having positive and negative power line connections, wherein said selective potential applying means comprises means for selectively connecting said power supply terminal to either said positive power line connection or said negative power line connection of said package of said semiconductor memory device.

3. A semiconductor memory device as defined in claim 2, wherein said selective connection means is formed by a wire-bonding process during the manufacture of the semiconductor memory device.

4. A semiconductor memory device as defined in claim 1, wherein said first decoder circuit comprises a plurality of first decoder transistors connected in parallel, each of said first decoder transistors comprising a gate which is connected to one of said address lines.

5. A semiconductor memory device as defined in claim 1, 3 or 4 wherein each of said second decoder circuits comprises a plurality of second decoder transistors connected in parallel, each of said second decoder transistors comprising a gate which is connected to one of said address lines.

6. A semiconductor memory device as defined in claim 5, wherein the number of said plurality of first decoder transistors is equal to the number of said address lines.

7. A semiconductor memory device as defined in claim 6, wherein the number of said plurality of second decoder transistors in each of said second decoder circuits is equal to one-half of the number of said address lines.

8. A semiconductor memory device as defined in claim 7, further comprising N cross-coupled latches, and wherein said first decoder circuit provides an output which causes each of said output gates of the first kind to connect one of said memory cell arrays with one of said latches.

9. A semiconductor memory device as defined in claim 8, further comprising an additional cross-coupled latch, and wherein each of said second decoder circuits causes said output gate of the second kind to connect said additional latch with a particular one of said N arrays which is selected by said address lines.

10. A semiconductor conductor memory device as defined in claim 1, wherein:

said means of said first decoder circuit connected to said power supply terminal comprises a transistor connected between the output of said first decoder circuit and ground with the gate thereof connected to said power supply terminal, said means of said N other decoder circuits connected to said power supply terminal comprise respective, N second transistors having the drains thereof connected to said power supply terminal and connected to said respective N decoder circuits for supplying power thereto from said power supply terminal.

* * * * *

UNITED STATES PATENT AND TRADEMARK OFFICE
CERTIFICATE OF CORRECTION

PATENT NO. : 4,354,256

DATED : October 12, 1982

INVENTOR(S) : Kiyoshi Miyasaka

It is certified that error appears in the above-identified patent and that said Letters Patent is hereby corrected as shown below:

Front page, [56] References Cited, "Varadibrairwood" should be --Varadibriarwood--;

Front page, second column, "OTHER PUBLICATIONS", line 3, "Rams" should be --RAM's--;

Front page, [57] ABSTRACT, line 6, after "per-word" (first occurrence) insert --and--;

Col. 1, line 40, after "necessary" insert --,--;

Col. 2, line 57, "$Q_7$ and $Q8$" should be --$Q_7$ and $Q_8$--.

Signed and Sealed this

Fifth Day of April 1983

[SEAL]

Attest:

GERALD J. MOSSINGHOFF

*Attesting Officer*  *Commissioner of Patents and Trademarks*